(12) United States Patent
Sporer et al.

(10) Patent No.: US 9,807,905 B2
(45) Date of Patent: Oct. 31, 2017

(54) ADAPTER COOLING APPARATUS AND METHOD FOR MODULAR COMPUTING DEVICES

(71) Applicant: General Electric Company, Schenectady, NY (US)

(72) Inventors: Bernd Sporer, Augsburg (DE); Klaus Weinmann, Augsburg (DE); Oleg Schneider, Augsburg (DE)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/951,808

(22) Filed: Nov. 25, 2015

(65) Prior Publication Data

US 2017/0150643 A1 May 25, 2017

(51) Int. Cl.
H05K 7/20 (2006.01)
H05K 5/00 (2006.01)

(52) U.S. Cl.
CPC ....... H05K 7/20154 (2013.01); H05K 5/0008 (2013.01); H05K 7/205 (2013.01)

(58) Field of Classification Search
CPC ... H05K 7/20154; H05K 7/205; H05K 5/0008
See application file for complete search history.

(56) References Cited

U.S. PATENT DOCUMENTS 5,699,235 A * 12/1997 Tsurumiya ........... H05K 1/0265
361/736
6,049,469 A * 4/2000 Hood, III ................ G06F 1/182
174/388
6,252,775 B1 * 6/2001 Kuroda .................. H05K 1/053
361/707
6,501,662 B2 * 12/2002 Ikeda ..................... H02M 7/003
174/252

(Continued)

FOREIGN PATENT DOCUMENTS

CN 101657781 2/2010
DE 202012007478 9/2012
WO 2015075611 A1 5/2015

OTHER PUBLICATIONS

Schmitz, Conduction-Cooled Rack System Design Offers Cost-Effective Versatility, ECN MEN Mikro Elektronik, (2010).

(Continued)

*Primary Examiner* — Dimary Lopez Cruz
*Assistant Examiner* — Matt Dhillon
(74) *Attorney, Agent, or Firm* — Meunier Carlin & Curfman LLC

(57) ABSTRACT

Disclosed herein are apparatuses and methods for the cooling of electronic components of a COM-Express module using an adapter module to become VITA-59 compliant module. The adapter module operatively and thermally couple to a modular computing device, e.g., the COM-Express compliant module, configured with a conduction-cooled plate to provide an additional path for conducting thermal energy generated from integrated circuit components located on the modular computing device. The adapter module includes dimensions and thicknesses to form a spatial gap between an assembled system having the adapter module, the cooling plate, and the modular computing device and a cooling surface of an external heat sink to which the assembled system couples. The spatial gap relative to the cooling plate provides clearance for the adapter module to elastically deform such that the surfaces of the assembly contacts the heat sink when the assembled system is coupled thereto.

17 Claims, 11 Drawing Sheets

(56) References Cited

U.S. PATENT DOCUMENTS

| | | | |
|---|---|---|---|
| 6,728,104 B1 * | 4/2004 | Ahmad | H05K 7/20563 |
| | | | 165/185 |
| 7,417,861 B2 * | 8/2008 | Kikuchi | H01L 25/162 |
| | | | 257/E23.105 |
| 7,623,349 B2 * | 11/2009 | Refai-Ahmed | H05K 1/0203 |
| | | | 174/252 |
| 7,773,378 B2 * | 8/2010 | Lin | G06F 1/20 |
| | | | 361/690 |
| 8,205,337 B2 | 6/2012 | Lower et al. | |
| 8,537,540 B2 | 9/2013 | Landon | |
| 8,616,266 B2 | 12/2013 | Wilcoxon et al. | |
| 2010/0202110 A1 * | 8/2010 | Becker | H05K 5/0082 |
| | | | 361/707 |
| 2012/0101776 A1 | 4/2012 | Brower et al. | |
| 2013/0329352 A1 * | 12/2013 | Nigen | H05K 7/205 |
| | | | 361/679.31 |
| 2014/0268576 A1 | 9/2014 | Wahler et al. | |
| 2015/0149686 A1 * | 5/2015 | Cannata | G06F 13/4022 |
| | | | 710/316 |
| 2015/0282383 A1 * | 10/2015 | Singh | H05K 1/021 |
| | | | 361/689 |
| 2015/0327354 A1 * | 11/2015 | Umeno | H05K 7/205 |
| | | | 361/720 |

OTHER PUBLICATIONS

Conduction Cooling for Chassis and Circuit Boards, MPE 635: Electronics Cooling, pp. 50-62.

\* cited by examiner

Section A-A

ADAPTER COOLING APPARATUS AND METHOD FOR MODULAR COMPUTING DEVICES

FIELD OF THE DISCLOSURE

Embodiments of the disclosure generally relate to a computing component, and more particularly, to a system and method for the cooling of modular computing devices.

BACKGROUND

One type of modular computing devices includes a cooling plate coupled to a circuit board of the modular computing device, where the cooling plate spans the area of the circuit board to provide thermal regulations of components populated on one side of the circuit board. Conduction cooled computing devices provide a compact and/or rugged configuration for use in a wide number of computing and control applications, particularly in industrial, telecommunication, aerospace, and military systems. An example of a conduction cooled standard is the COM Express module, which is defined in the COM Express Module Base Specification and the VITA 59 standard.

Because of their compact and/or rugged form, conduction cooled computing components often have a higher thermal density and pose a challenge to system designers using such devices. For example, such devices may have components on both sides of a circuit board and mounts to a base board such as a carrier card. This arrangement makes cooling of components between the circuit board and the base board difficult.

In one installed configuration of a conduction-cooled module (e.g., conduction-cooled COM Express module), the cooling plate and circuit board are coupled to one another, as a system, and are then coupled to a carrier card. In such configuration, integrated circuits and other heat-generating components of the module, located in a closed area defined between the module and the carrier card, are indirectly cooled whereby heat generated from such components have to radiate through the circuit board of the module to the opposite side of the module where the cooling plate is located. This lack of direct cooling results in the integrated circuits in the closed area having a higher operating temperature as compared to other components of the module. Moreover, lack of direct heat removal from the closed area between the module and the carrier card limits this area of the module to placements of additional, or higher density, computing components.

Though active thermal regulation systems are available, passive conduction and convection thermal regulation systems are often preferred for their simplicity and robustness in many applications. And, as the requirements for processing density, functionality, and compactness of computing systems have increased over time for embedded control systems, greater heat dissipation capability is desired.

Therefore, what are needed are devices, systems and methods that overcome challenges in the present art, some of which are described above.

SUMMARY

Disclosed herein are apparatuses and methods for the cooling of electronic components of a COM-Express module which by application of the adapter can become a VITA-59 compliant module using the adapter module. The adapter module operatively and thermally couple to a modular computing device (e.g., the COM-Express or other devices following the same mounting and cooling principals) configured with a conduction-cooled plate to provide an additional path for conducting thermal energy generated from integrated circuit components located on the modular computing device. The adapter module includes dimensions and thicknesses to form a spatial gap between an assembled system having the adapter module, the cooling plate, and the modular computing device and a cooling surface of an external heat sink to which the assembled system couples. The spatial gap relative to the cooling plate provides clearance for the adapter module to elastically deform such that the surfaces of the assembly contacts the heat sink when the assembled system is coupled thereto.

The exemplified adapter module further provides a direct thermal conduction path of heat generated by integrated circuit components located in closed regions between the modular computing device and a base board (e.g., carrier board, processor board, motherboard) to which the modular computing device is attached.

The exemplified adapter module increases the footprint of the modular computing device and its corresponding cooling plate. In some embodiments, thermal conduction of the overall modular computing device is improved by over 19% as compared to use of just the cooling plate.

In an aspect, a system having a modular computing device, a first cooling member, and a second cooling member is disclosed. The modular computing device (e.g., COM express board) has interfaces for coupling to a base board and includes a circuit board with two opposing mountable surface areas, including a first surface area and a second surface area, for placement of integrated circuit (IC) components. When in an assembled configuration with the base board, the circuit board is stacked with the base board such that the second surface area is proximal to the base board and the first surface is distal to the base board.

The first cooling member (e.g., COM express conduction plate) includes a first base structure having a first cooling surface (e.g., planar contact area) for coupling to a cooling surface of an external heat sink (e.g., fins, chassis, heat-pipe, heat spreader), the first base structure being fixably positioned proximal (e.g., fixably mounted) to the first surface area of the circuit board so as to form direct thermal conduction with surfaces associated with one or more IC components mounted on the first surface area of the modular computing device.

The second cooling member (e.g., an adapter) includes a second base structure that is fixably positioned proximal to the second surface area of the circuit board so as to form direct thermal conduction with one or more IC components mounted on the second surface area of the modular computing device. The second member includes one or more side walls extending from the second base structure. Each side wall includes a second cooling surface and a wall contact surface, wherein when in the assembled configuration with the first cooling member and the modular computing device, each side wall of the second cooling member is proximately positionable (e.g., to make near and/or direct contact therewith) with respect to the first cooling member such that the wall contact surface forms direct thermal conduction therewith and such that each of the first cooling surface and the second cooling surface forms direct thermal conduction with the cooling surface of the external heat sink.

In some embodiments, the first cooling surface of the first member (e.g., the cooling plate) substantially spans the first surface area of the modular computing device and directly contacts the cooling surface of the external heat sink when the system is in the assembled configuration.

In some embodiments, the second cooling surface of the second member (e.g., the adapter) spans beyond the first cooling surface of the first base structure and directly contacts the cooling surface of the external heat sink when the system is in the assembled configuration.

In some embodiments, the external heat sink includes one selected from the group consisting of a chassis, a heat sink, a heat spreader, a heat pipe, a cooling recirculation loop, and a mechanical fan.

In some embodiments, the system includes one or more attachment members (e.g., screws or bolt) to couple the base board, modular computing component, first cooling member and second cooling member together as a modular assembly, and to couple the modular assembly to the external heat sink, wherein, prior to the one or more attachment members being coupled to the external heat sink, the modular assembly includes a spatial gap between the first cooling surface of the first base structure of the first member and the cooling surface of the external heat sink when the modular assembly is disposed on the cooling surface of the external heat sink (e.g., when the second cooling surface of the one or more side walls of the second member is flushed against the cooling surface of the external heat sink). In some embodiments, the second base structure (e.g., plate region of the adapter) of the second member is configured to elastically deform (e.g., bend) when the one or more attached members are affixed to the external heat sink such that the contact surface (e.g., in its entirety) of the second cooling member directly contacts the cooling surface of the external heat sink.

In some embodiments, the second base structure (e.g., plate region of the adapter) of the second member is configured to elastically deform (e.g., bend) when the one or more attached members are affixed to the external heat sink such that first cooling surface of the first cooling member aligns with the second cooling surface of the second cooling member to form a contact plane with the cooling surface of the external heat sink.

In some embodiments, the system includes one or more attachment members (e.g., screws or bolt) to couple the base board, modular computing component, first cooling member and second cooling member together as a modular assembly, and to couple the modular assembly to the external heat sink, wherein, prior to the one or more attachment members being coupled to the external heat sink, the modular assembly includes a spatial gap between the wall contact surface of the second cooling member and the cooling surface of the external heat sink when the modular assembly are disposed on the cooling surface of the external heat sink.

In some embodiments, the second base structure of the second cooling member has a first maximum thickness and wherein the one or more walls of the second cooling member has a second maximum thickness, and wherein the second maximum thickness is greater than the first maximum thickness.

In some embodiments, the second base structure and the one or more side walls of the second member (e.g., the adapter) form a single continuous structure.

In some embodiments, the second base structure of the second member, when applied to the first base structure, makes the modular computing device and first cooling member become a VITA-59 compliant module.

In some embodiments, the circuit board of the modular computing device is dimensioned to conform to a Computer-On-Module (COM) Express standard.

In some embodiments, when the first member and second member are in an assembled configuration, the contact surface, of the second base structure (e.g., of the adapter) positioned proximal to the second surface area of the circuit board, forms a predetermined distance to the contact surface, of the first base structure (e.g., of the plate), positioned proximal to the first surface area of the circuit board.

In some embodiments, the system includes one or more thermal interface layers (e.g., comprising, in part, thermal grease) formed between the one or more integrated circuits of the circuit board of the modular computing device and the first base structure of the first member (e.g., the plate). In some embodiments, a thermal interface material is applied between the modular computing device and the second base structure.

In another aspect, an apparatus (e.g., adapter) for coupling a modular computing assembly to a heat sink (e.g., an external heat sink, a chassis, cooling fins, a fan, a heat pipe, a recirculation loop, a heat spreader) is disclosed. The modular computing assembly has a modular computing device (e.g., a conduction-cooled COM Express module) coupled to a cooling plate, the apparatus includes a base structure, wherein the base structure is proximally positionable to a first surface area of a circuit board of a modular computing device so as to form direct thermal conduction with a first set of one or more IC components mounted on the first surface area of the modular computing device; and one or more side walls extending from the base structure, each side wall including a cooling surface and a wall contact surface, wherein when in the assembled configuration with the modular assembly, each of the one or more side walls is proximately positionable (e.g., to make near and/or direct contact therewith) with respect to the cooling plate such that the wall contact surface forms direct thermal conduction therewith and such that each of cooling plate of the modular assembly and the cooling surface of the one or more side walls forms direct thermal conduction with the heat sink.

In another aspect, a method is disclosed for coupling a modular computing assembly to a heat sink so as to form direct thermal contact therebetween, the modular computing assembly having a conduction-cooled COM Express module coupled to a cooling plate and a cooling adapter. The method includes positioning a base structure of the cooling adapter in proximal contact with a conduction-cooled COM Express module so as to form i) a first thermal conduction path with a first set of one or more integrated circuits mounted on a circuit board of the COM Express module and ii) a second thermal conduction path with a side wall of the cooling plate of the modular computing assembly, the base structure having one or more side walls extending therefrom wherein each of the one or more side walls are dimensioned to form a spatial gap between a cooling surface of the heat sink and a corresponding cooling surface of at least one of the cooling adapter and the cooling plate when the one or more side walls of the cooling adapter or the cooling plate directly contacts the cooling surface of the heat sink; and inserting attachment members through apertures of the cooling adapter, conduction-cooled COM Express module, and cooling plate to couple the modular computing assembly to the heat sink wherein the insertion elastically bends the base structure of the cooling adapter to close the spatial gap between the cooling surface of the heat sink and the corresponding cooling surface of the at least one of the cooling adapter and the cooling plate such that both the cooling adapter and cooling plate directly contacts the cooling surface of the heat sink.

BRIEF DESCRIPTION OF THE DRAWINGS

The components in the drawings are not necessarily to scale relative to each other and like reference numerals designate corresponding parts throughout the several views.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Figure 1:
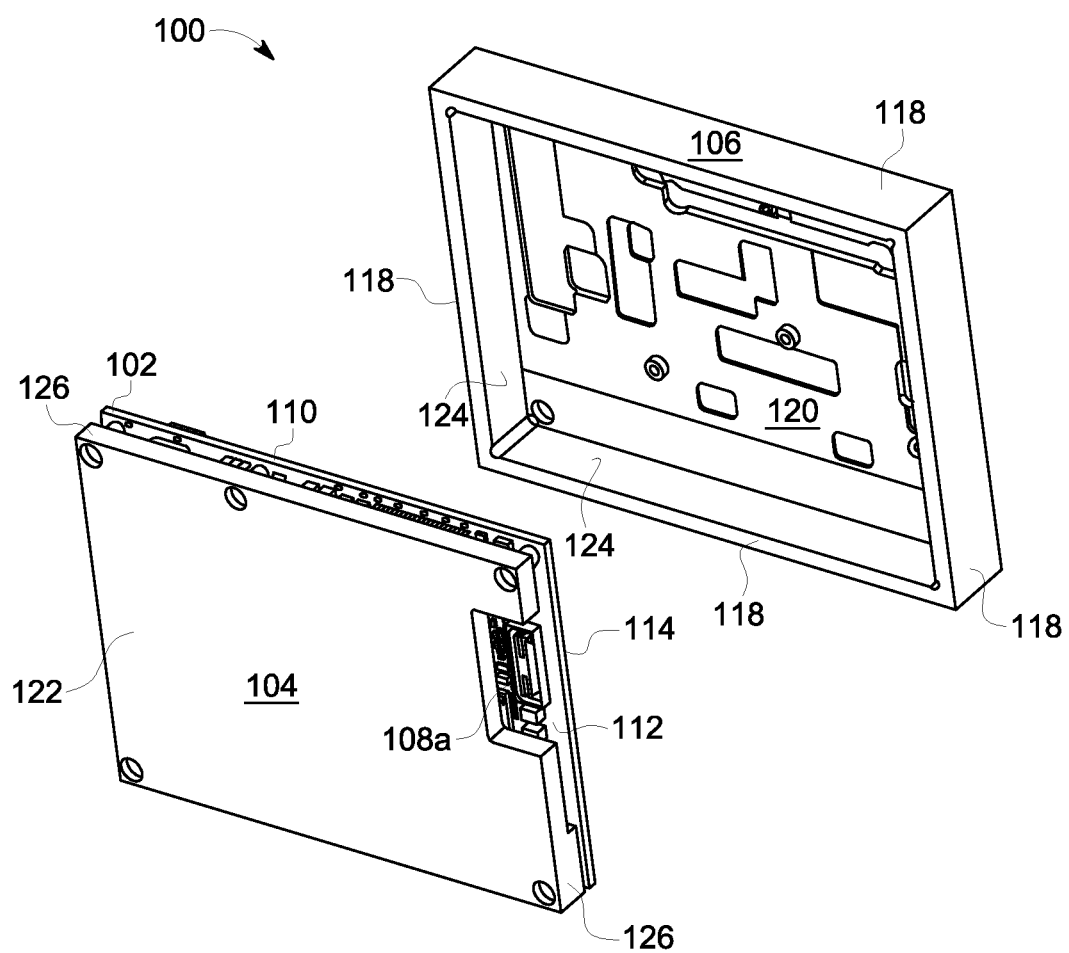
FIG. 1 depicts an example modular computing device configured with two base structures so as to provide thermal regulation for integrated circuit components on both sides of the modular computing device in accordance with an illustrative embodiment.

FIG. 1 depicts a system 100 with a modular computing device 102 configured with two base structures, including a conduction cooled plate 104 and an adapter module 106, so as to provide direct cooling to integrated circuit components 108 (shown as 108a and 108b—see FIGS. 1 and 2) on each side of the modular computing device 102 in accordance with an illustrative embodiment.

The modular computing device 102 includes a circuit board 110 (e.g., a printed circuit board "PCB" such as a COM Express board, a rugged COM Express Board, etc.) with two opposing mountable surface areas, including a first surface area 112 and a second surface area 114, for integrated circuit (IC) components 108. The circuit board 110 and integrated circuit (IC) components 108, collectively, form a single-board computing device (e.g., a single board computer).

The conduction cooled plate 104 (also referred to as a "cooling plate 104", as a first base member) includes a first base structure 122 positioned proximal (e.g., fixably mounted) to the first surface area 112 of the circuit board 110 so as to form direct thermal conduction with surfaces associated with one or more IC components 108a mounted on the first surface area 112 of the modular computing device 102. The adapter module 106, as a second base member, includes a second base structure 120 positioned proximal to the second surface area 114 of the circuit board 110 so as to form direct thermal conduction with surfaces associated with one or more IC components 108b (see FIG. 2) mounted on the second surface area 114 of the modular computing device 102. The adapter module 106 includes one or more side walls 118 extending from the second base structure 120. Each side wall 118 includes a contact surface 124 proximately positionable (e.g., to make near and/or direct contact therewith) to a corresponding surface 126 on the first base structure 122 so as to form direct thermal conduction therewith. In some embodiments, the second base structure 120 and the one or more side walls 118 form a single continuous structure. Though referred to as a cooling plate, it should be understood to those skilled in the art that the cooling plate 104 can provide heating functionality to integrated components of the modular computing device in certain operating conditions thereof.

Figure 2A:
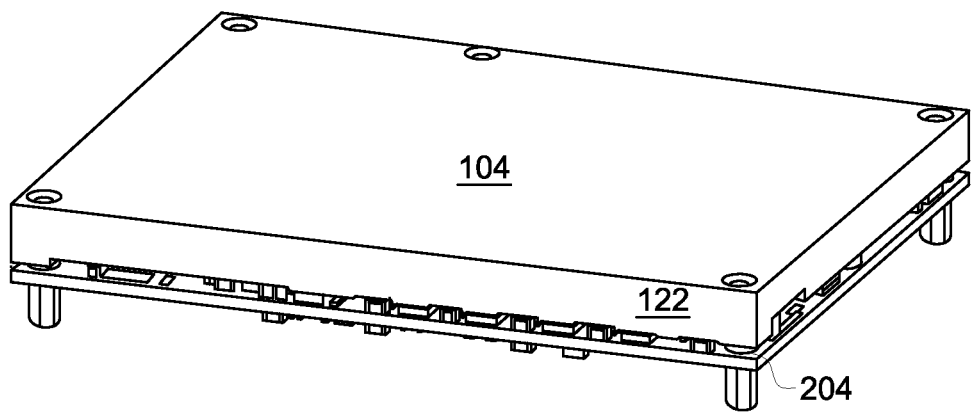
FIG. 2, comprising of FIGS. 2A and 2B, depicts top and bottom views of an exemplary modular computing device configured with a first base structure to receive the adapter module in accordance with an illustrative embodiment.
Figure 2B:
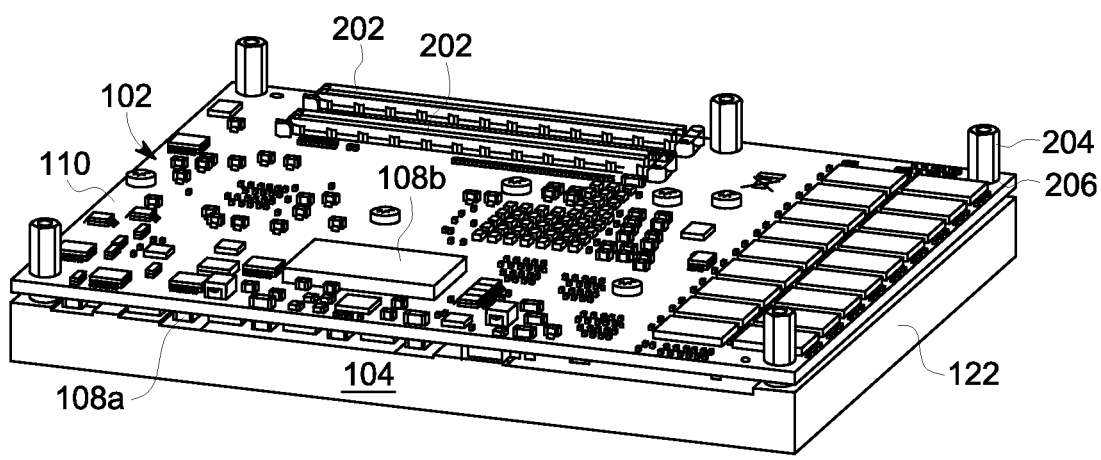

FIG. 2, comprising of FIGS. 2A and 2B, depicts first and second views (e.g., top and bottom views) of an exemplary modular computing device 102 configured with the conduction cooled plate 104 to receive the adapter module 106 in accordance with an illustrative embodiment. In some embodiments, the modular computing device 102 and the first base structure 122 are dimensioned to comply with a standard such as the COM Express specification. In some embodiments, the modular computing device 102 has a dimension of about 55 mm×84 mm (e.g., COM Express mini). In another embodiment, the modular computing device 102 has a dimension of about 95 mm×95 mm (e.g., COM Express compact). In another embodiment, the modular computing device 102 has a dimension of about 95 mm×125 mm (e.g., COM Express basic). In another embodiment, the modular computing device 102 has a dimension of about 110 mm×155 mm (e.g., COM Express extended). In other embodiments, the modular computing device and the first base structure 122 are dimensioned to comply with other COM express and VITA 59 standards.

FIG. 2B depicts the bottom side of the electronic board as a COM Express module. The module includes mounting features 206 (e.g., mounting holes) in the circuit board 110 to allow for screws and/or standoff components 204 to fixably mount the module 102 to the first base structure 122. The module acts as a heat spreader to move thermal energy between a heat source (namely, the IC of the computing device) and a secondary heat exchanger such as an external heat sink or heat spreader to which the module is in communication therewith. Examples of these external heat sink or heat spreader includes, but not limited to, a chassis or cabinet or bus bars to which the system 100 is mounted, as well as a mechanical fan, a recirculation loop, a heat pipe, among others. In some embodiments, the mounting features includes a screw, a thermally conductive tape or epoxy, a wire-form z-clip, a flat-spring clip, a stand-off spacer, and/or a push pin.

Still referring to FIG. 2B, two connectors 202 to connect to a base board (e.g., an external carrier board) are shown. The two connectors 202 serves as an interface for the carrier board and, in some embodiments, is a multiple-pin terminal connector (e.g., comprising a serial bus connection) arranged in an array for coupling to a corresponding multiple-pin terminal connector on the external carrier board.

In some embodiments, the external carrier board is a circuit board configured with multiple reserved sites for the attachments of modular computing devices, for example, as those shown herein. The carrier board may include a databus accessible to the modular computing device 102 via the connectors 202 to provide a connectivity between the modular computing device 102 and the carrier board and/or second modular computing devices (not shown) attached to the carrier board. In other embodiments, the carrier board is another computing device such as a single board computer.

Still referring to FIG. 2B, the circuit board 110 is coupled to the first base structure 122 such that heat dissipation of the electronic devices 108a on the circuit board 110, such as processor, logic, memory, chipset and such, conducts to the first base structure 122, also referred to herein as the "heat spreader" or "cooling plate." The first base structure 122 is mountable, in some embodiments, to an enclosure, a housing or a heat sink to which the heat flux finally is conducted. As shown, the components 108b at the connector side 114 have a longer thermal connection path to the cooling plate 104 as compared to components 108a on the heat spreader side 112 of the modular computing device 102. In being able to provide an additional path for conducting thermal energy generated from integrated circuit components located on the modular computing device, whereby the disclosed adapter module 106 enables direct thermal conduction paths to form on both sides of the computing module, greater processing and functional capacity of the modular computing device and connected computing devices can be realized. In particular, the adapter module 106 provides an independent thermal path for components on the connector side of the modular computing device. This apparatus enhances the thermal regulation of integrated components 108 of the modular computing device 102. In some embodiments, the feature further enables an improved shock and vibration tolerance of the components as well as of the overall device 102.

In some embodiments, the first base structure 122 of the plate 104 has a surface area substantially spanning the first surface area of the modular computing device 102. In other embodiments, the first base structure 122 has a surface area, at least, spanning the first surface area of the modular computing device 102.

Figure 3:
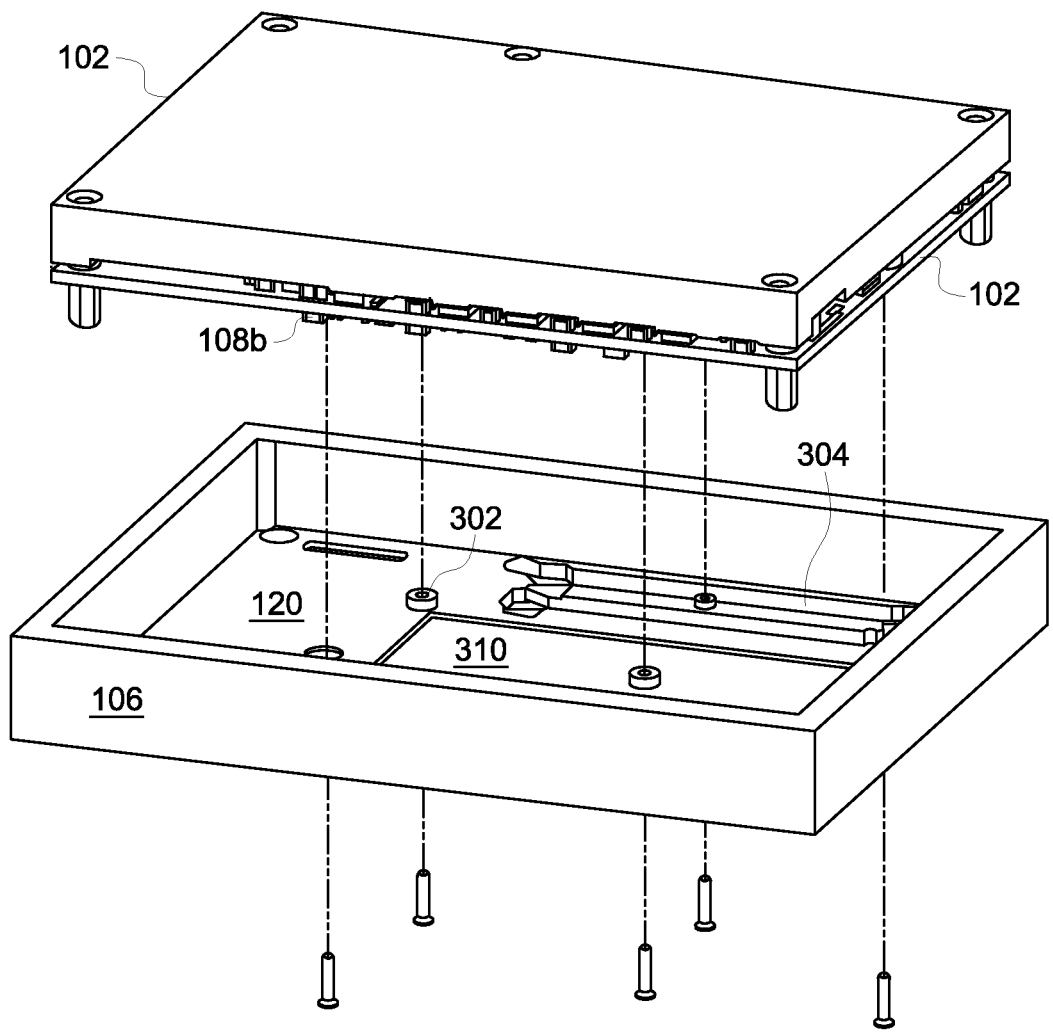
FIG. 3 depicts a first view of an exemplary adapter module for coupling to the modular computing device of FIG. 2 in accordance with an illustrative embodiment.

FIG. 3 depicts an exemplary adapter module 106 for coupling to the modular computing device 102 of FIG. 2 in accordance with an illustrative embodiment. The adapter module 106 provides a direct thermal path for thermal energy generated and/or dissipated from electrical components 108b on the connector side 114 of the modular computing device 102. The adapter module 106, in some embodiments, is configured to receive a standard COM express board coupled to a cooling plate.

The adapter module 106 includes one or more mounting features 302 (e.g., mounting holes) to align to corresponding mounting standoffs 204 of the modular computing device 102. The adapter module 106 includes one or more apertures 304 for providing a connector termination for the multiple-pin terminal connector of the circuit board. The one or more apertures 304 is disposed at a location aligned to the connectors 202 of the modular computing device 102.

In some embodiments, the adapter module 106 is dimensioned to be compliant to the specification of the COM Express standard so as to fit at the closed area between the circuit board 102 and the base board to which the circuit board 102 couples.

In some embodiments, the adapter module 106 is dimensioned so as to form direct thermal contact with electrical components 108*b* of the modular computing device 102.

Referring still to FIG. 3, the adapter module 106 includes mounting holes 306 in the central region of the base structure 120. These mounting holes 306 improves the vibration and shock resistance of the circuit board 110 in maintaining the circuit board 110 fixed relative to the adapter module 106. In some embodiments, mounting screws 308 are used to fixably attach the adapter module 106 to the circuit board 110.

Referring still to FIG. 3, the base structure 120 of the adapter module 106 includes one or more recess regions 310 which corresponds to the placement of integrated circuits of the modular computing device 102. In some embodiments, the depth of the recess regions 310 are selected such that electrical components 108 at the circuit board 110 are in direct thermal contact with the adapter module 106.

In some embodiments, the adapter module 106 has a footprint compliant to the specification of VITA 59. In other embodiments, the adapter module 106 has a footprint that is compliant to other standards. In other embodiments, the adapter module 106 has a foot print that is customized.

In some embodiments, the base structure 120 of the adapter module 106 has a surface area substantially spanning the surface area of the modular computing device 102. In other embodiments, the base structure 120 of the adapter module 106 has a surface area, at least, spanning the surface area of the modular computing device 102. It is found that the greater surface footprint contributes to the enhancement of the thermal regulation of the modular computing device by 15 to 20 percent.

The adapter module 106 and the cooling plate 104 are preferably made of a thermally conductive material. Examples of such materials include, but not limited to, graphite, copper, aluminum, aluminum alloy, copper-tungsten pseudo-alloy, silicon carbide in aluminum matrix (e.g., AlSiC), diamond in copper-silver alloy matrix (e.g., Dymalloy), and/or beryllium oxide in beryllium matrix. In some embodiments, the base structure 120 of the adapter module 106 is made of the same material as the base structure 122 of the cooling plate 104.

In some embodiments, the base structure 120 of the adapter module 106 is made a material having similar or the same coefficient of thermal expansion as the cooling plate 104.

In some embodiments, the base structure 120 of the adapter module 106 is made of a different material as the base structure 122 of the cooling plate 104.

In some embodiments, a portion of the adapter module is hollow. In some embodiments, portions of the adapter module includes a matrix structure (e.g., a honeycomb matrix structure).

Figure 4:
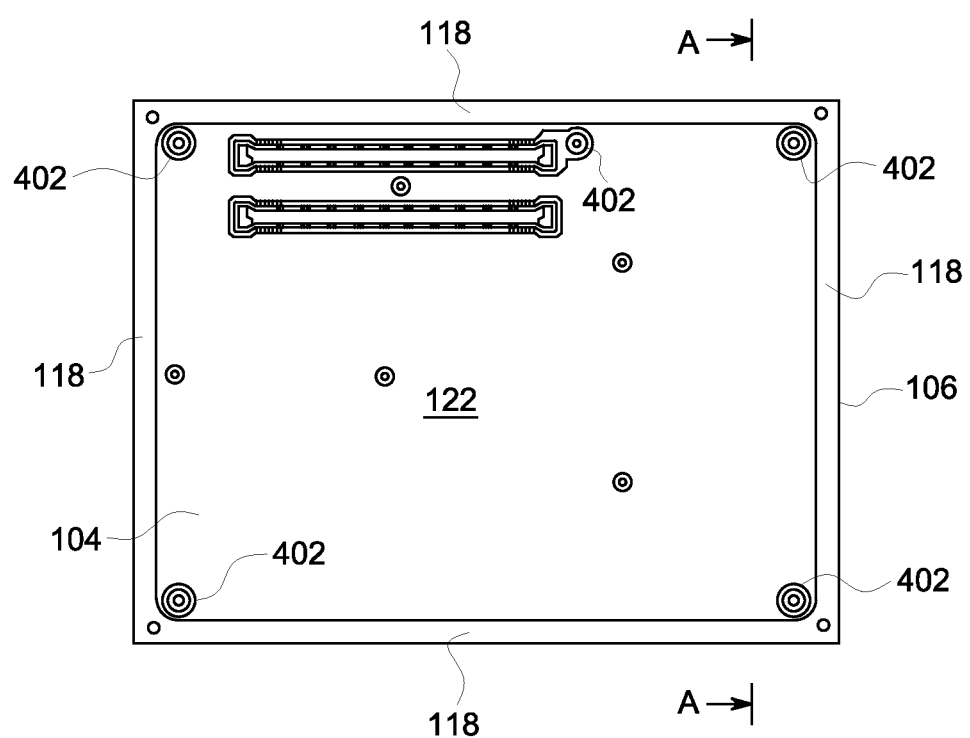
FIG. 4 depicts a second view of the exemplary adapter module of FIG. 3 in accordance with an illustrative embodiment.

FIG. 4 depicts a bottom view of the exemplary adapter module 106 of FIG. 3 in accordance with an illustrative embodiment. The one or more side walls 118 of the second base structure 120 of the adapter module 106 surrounds the first base structure 122 of the first member so as to form direct thermal contact therewith. As shown, the adapter module has a footprint greater than that of the cooling plate 104. As shown in FIG. 4, the adapter module increase the thermal connection surface by about 19 percent.

Because, in some embodiments, the adapter module is compliant with VITA 59 (e.g., VITA 59 compliant mounting points, outlines, and heights, among others), the assembly of the adapter module 106 with the modular computing device 102 and its corresponding cooling plate 104 results in the modular computing device 102 being VITA-59 compliant as well. For example, the adapter module has VITA-59 and/or COM-Express compliant mounting holes 402 that align with those of the cooling plate 104 and the COM express module 102.

In some embodiments, the one or more side walls 118 of the second base structure 120 of the adapter module 106 has a projecting contact surface corresponding to an area forming a perimeter around the first base structure 122 of the cooling plate 104. In such embodiments, the thermal conduction path is generally perpendicular to the contact surface of the adapter module.

Figure 5:
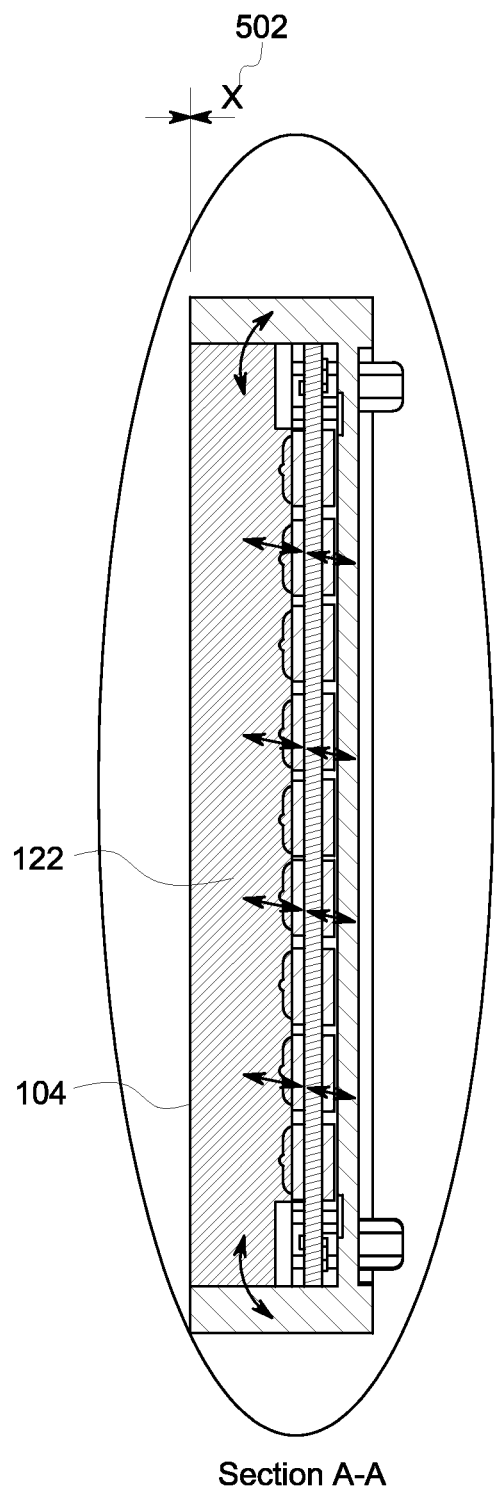
FIG. 5 depicts a cross-sectional side view of the exemplary adapter module of FIG. 4 in accordance with an illustrative embodiment.

FIG. 5 depicts a cross-sectional side view of the exemplary adapter module of FIG. 4 in accordance with an illustrative embodiment. The adapter module 106 is dimensioned such that the base structure 122 of the cooling plate 104 preferably flushes against the walls 118 of the adapter module 106 when coupled to one another. In some embodiments, adapter module 106 is dimensioned such that the base structure 122 of the cooling plate 104 generally flushes against the walls 118 of the adapter 106 so as to form a plane, when coupled to one another, whereby the adapter module 106 and cooling plate 104 can mount to an external carrier card.

Because, in some embodiments, the adapter module 106 is independently positionable relative modular computing device 102 and the cooling plate 104, the adapter 106 includes means to allow alignment of the adapter module 106 and the cooling plate 104.

In some embodiments, the adapter module 106 includes an offset 502 (shown as "X 502" in FIG. 5) relative to the surface of the cooling plate 104 (adapter is higher, e.g., cooling plate is connected to an external heat sink). During installation of the cooling plate 104 to an external heat sink, the adapter module 106 is elastically deformed to be flushed to the cooling plate 104 to form a good thermal conduction path.

In other embodiments, the adapter module 104 includes an offset 502 relative to the surface of the cooling plate 104 (adapter is lower, i.e., connected to an external heat sink). In this case, the adapter module 106 is first coupled to the external heat sink. The cooling plate is inserted into the adapter module such that the adapter module is elastically deformed and flushed with the cooling plate 104 to form a good thermal conduction path.

In some embodiments, a thermal interface material (TIM) is applied between two or more the at least one heat producing component and the base structures of the adapter module 106 and the cooling plate 104. In some embodiments, the thermal interface material is selected based on a contact pressure property, an electrical resistivity property, or a dielectric strength property. In some embodiments, the thermal interface material includes thermal grease, e.g., epoxy, a silicone, a urethane, and an acrylate. In some embodiments, the thermal interface material includes a material comprising a solvent-based solution, a hot-melt adhesive, and/or a pressure-sensitive adhesive tape. In some embodiments, the thermal interface material includes a material comprising aluminum oxide, boron nitride, zinc oxide, and/or aluminum nitride. In some embodiments, the filler module includes a material comprising graphite, copper, aluminum, silver, gold, aluminum alloy, diamond, copper-tungsten pseudo-alloy, silicon carbide in aluminum matrix (e.g., AlSiC), diamond in copper-silver alloy matrix (e.g., Dymalloy), and/or beryllium oxide in beryllium matrix. In some embodiments, the thermal interface material completely fills an interface gap between i) the at least one heat producing components of the circuit board and ii) the adapter module 106. In some embodiments, the thermal interface material completely fills an interface gap between i) the at least one heat producing components of the circuit board and ii) the cooling plate 104.

Figure 6:
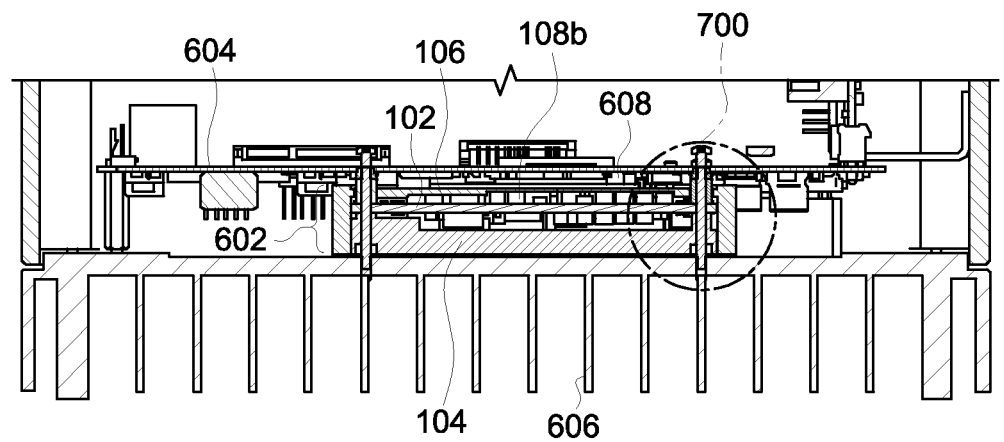
FIG. 6 depicts a cross-sectional side view of a modular computing assembly coupled to a base board, the modular computing assembly including a conduction-cooled COM express module coupled to a cooling plate and a cooling adapter in accordance with an illustrative embodiment.
Figure 7:
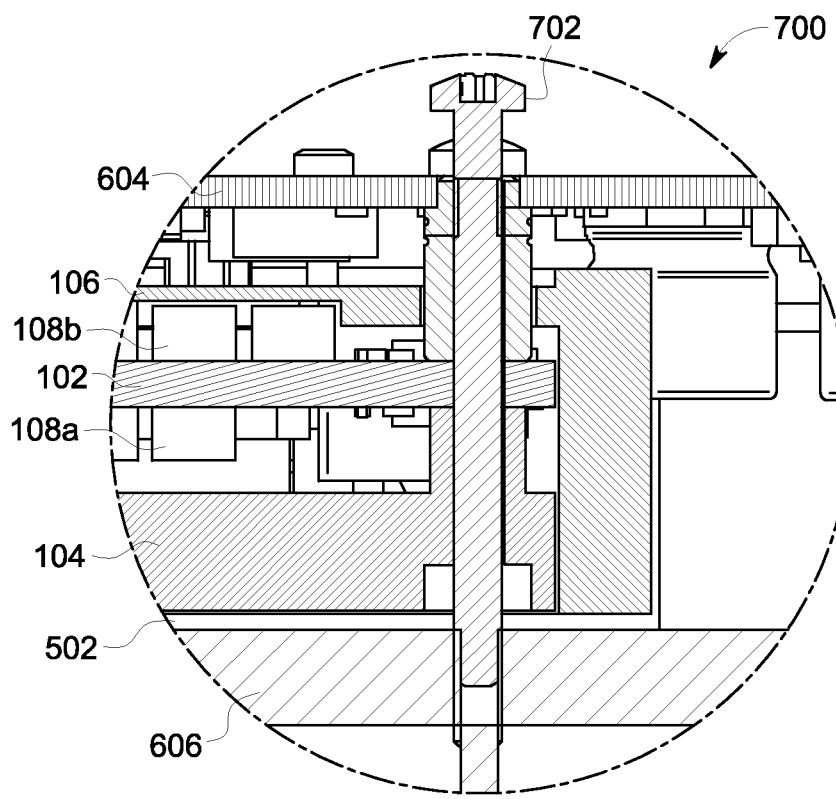
FIG. 7 depicts a detailed view of FIG. 6, the view shows the modular computing assembly having a spatial gap with an external heat sink in accordance with an illustrative embodiment.

FIG. 6 depicts a cross-sectional side view of a modular computing assembly 602 coupled to a base board 604, the modular computing assembly 602 including a conduction-cooled COM express module 102 coupled to a cooling plate 104 and a cooling adapter 106 in accordance with an illustrative embodiment. The modular computing assembly 602 is coupled to an external heat sink 606, which serves as a part of the chassis enclosing the modular computing assembly 602. As shown in FIGS. 6 and 7, the cooling adapter 106 is in direct contact with integrated circuits 108b of the modular computing device 102 as well as components 608 of the base board 604.

FIG. 7 depicts a detailed view 700 of FIG. 6, the view shows the modular computing assembly 602 having a spatial gap 502 with an external heat sink 606 in accordance with an illustrative embodiment. An attachment member 702 (e.g., screw or bolt) is placed through the modular computing assembly 602, including through the base board 604 to which the modular computing assembly 602 couples, a spacer 704, cooing adapter 106, the modular computing device 102, and the cooling plate 104, to couple to the external heat sink 606.

Figure 8:
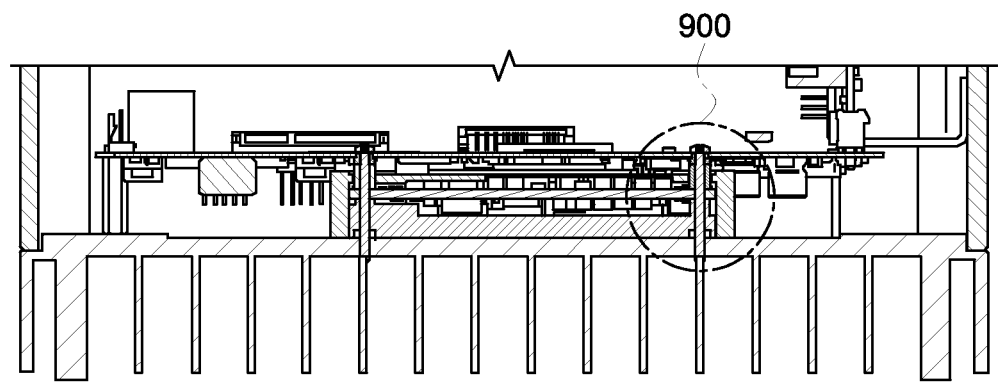
FIG. 8 depicts a cross-sectional side view of a modular computing assembly of FIG. 6, with the adapter of the conduction-cooled COM express module being elastically bent to allow direct thermal contact between the heat sink and the modular computing assembly in accordance with an illustrative embodiment
Figure 9:
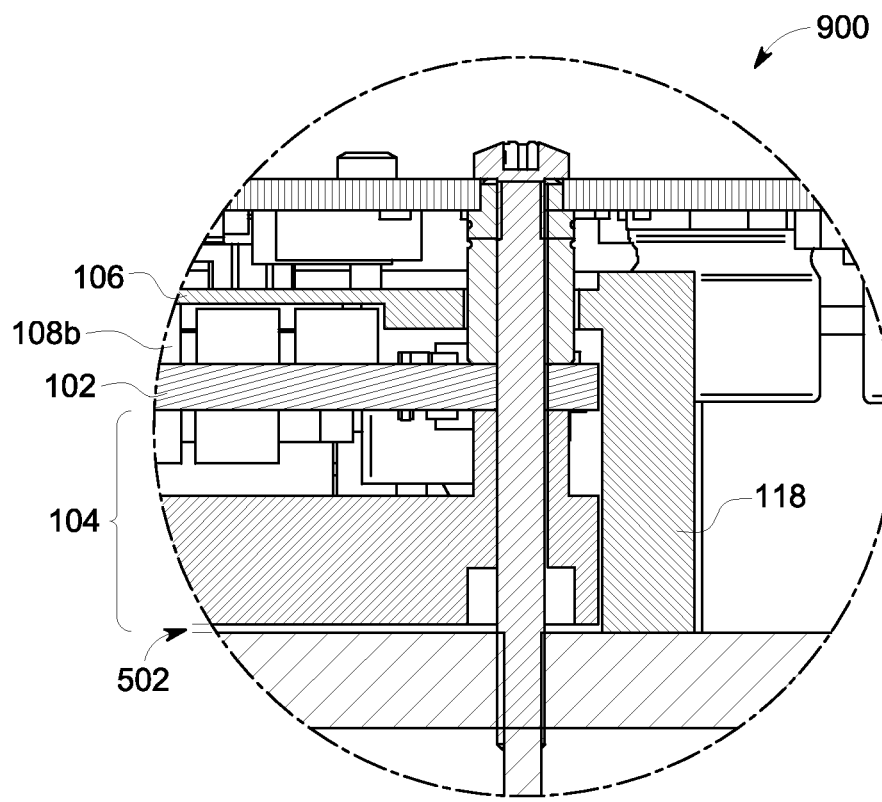
FIG. 9 depicts a detailed view of the modular computing assembly of FIG. 8 in accordance with an illustrative embodiment.

FIG. 8 depicts the modular computing assembly 602 of FIG. 7 disposed on the external heat sink, the modular computing assembly to form the spatial gap 502 between the heat sink 606 and the cooling plate 104, and FIG. 9 shows a detail view 900 of the modular computing assembly 602 of FIG. 8. The attachment member 702 is in a first configuration wherein it is coupled to the heat sink 606. In some embodiments, the walls 118 forms an internal cavity that spans the height of the modular computing device 102 and components 108b thereon, and the cooling plate 104 so as to be almost flushed with the cooling surface 802 of the cooling plate, absent the offset 502 corresponding spatial gap.

Figure 10:
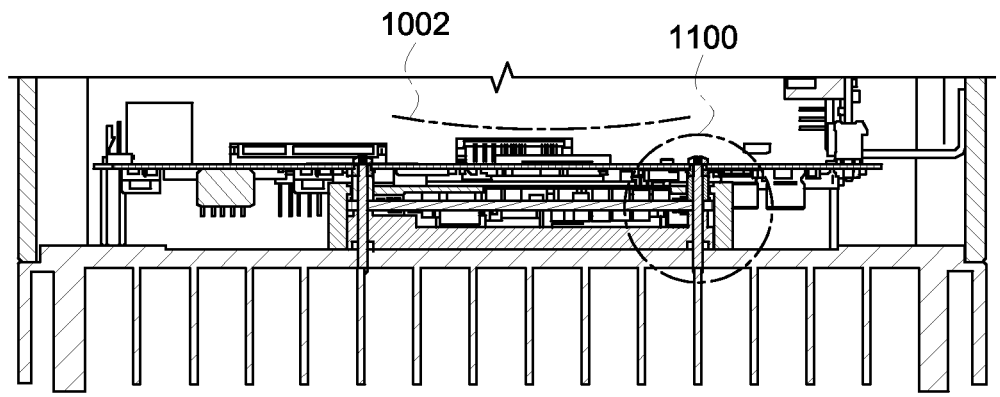
FIG. 10 depicts a modular computing assembly of FIG. 6 with the cooling adapter being elastically bent to allow direct thermal contact between the heat sink and the modular computing assembly in accordance with an illustrative embodiment.
Figure 11:
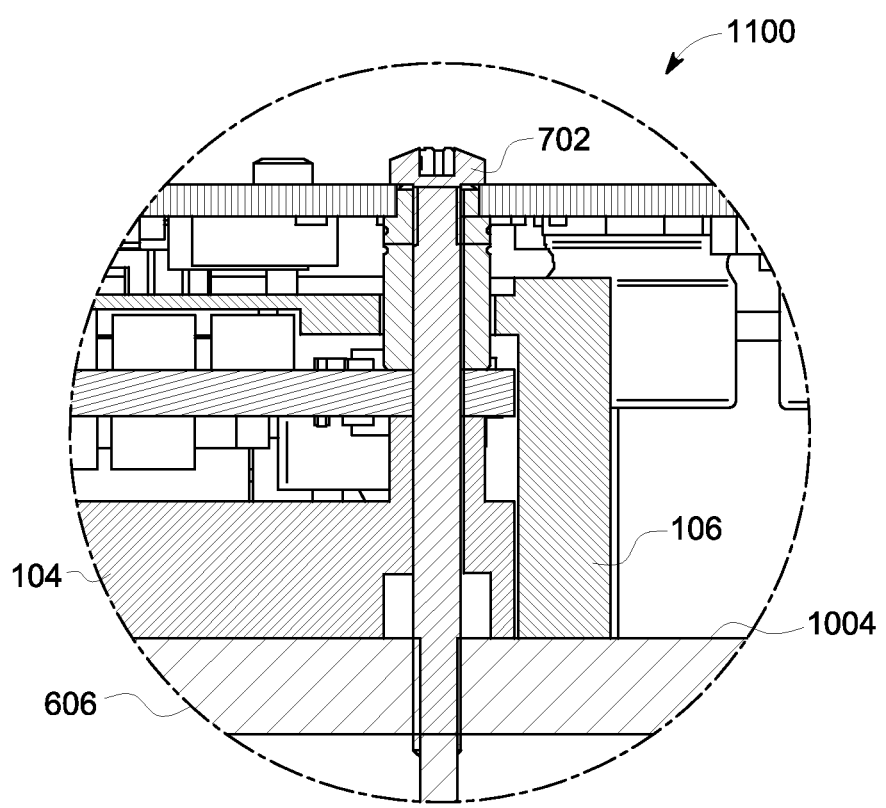
FIG. 11 shows a detail view of the modular computing assembly of FIG. 10 in accordance with an illustrative embodiment.

FIG. 10 depicts the modular computing assembly 602 of FIG. 6 with the cooling adapter 106 being elastically bent to allow direct thermal contact between the heat sink and the modular computing assembly in accordance with an illustrative embodiment, and FIG. 11 shows a detail view 1100 of the modular computing assembly 602 of FIG. 10. The attachment member 702 is in a second configuration and asserts an axial force onto the cooling plate 106.

Because the cooling plate 104 moves independently with respect to the cooling adapter 106, the contact surface of the cooling plate 104 would not align with the contact surface of the cooling adapter 106. By intentionally making the height of the cooling adapter (e.g., at the side wall 118) is slightly greater than the components of the COM express board 102 and cooling plate 104 (as shown in FIG. 9), and accounting for the tolerances of such components, a spatial gap 502 forms and provides a space to which the cooling adapter 106 can elastically deform in a concave manner (as shown in concave profile 1002 in FIG. 10) when the attachment members 702 are in the assembled configuration with the modular computing assembly 602 and heat sink 606. To this end, cooling plate 104 and the cooling adapter 106 are in direct contact with cooling surface 1004 of the heat sink 606. The bending of the cooling adapter 106 provides tension to maintain this direct contact, which enhances the thermal transfer operation of the modular computing assembly 602.

In some embodiments, the cooling surface 1004 is planar. In other embodiments, the cooling surface 1004 includes protrusions and/or grooves to which the corresponding surfaces of the cooling adapter 106 and cooling plate 104 are suitably dimensioned to make contact therewith when the cooling adapter 106 is elastically deformed.

Figure 12:
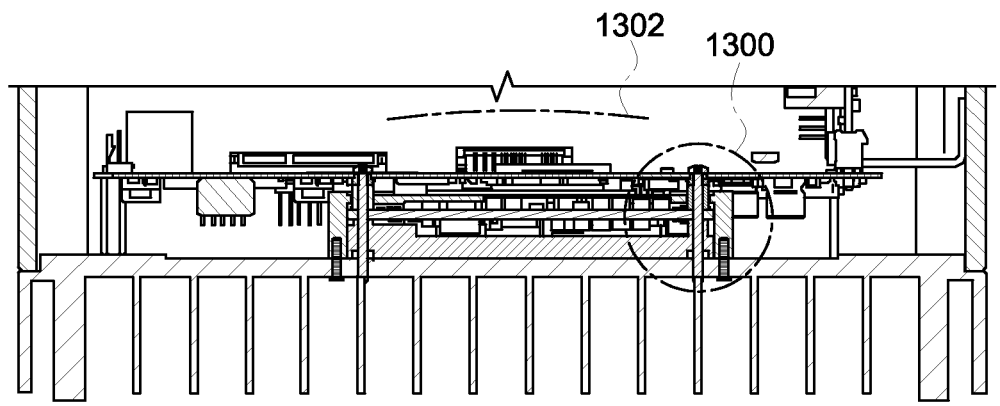
FIG. 12 depicts a cross-sectional side view of a modular computing assembly coupled to a base board, the modular computing assembly including a conduction-cooled COM express module coupled to a cooling plate and a cooling adapter in accordance with another illustrative embodiment
Figure 13:
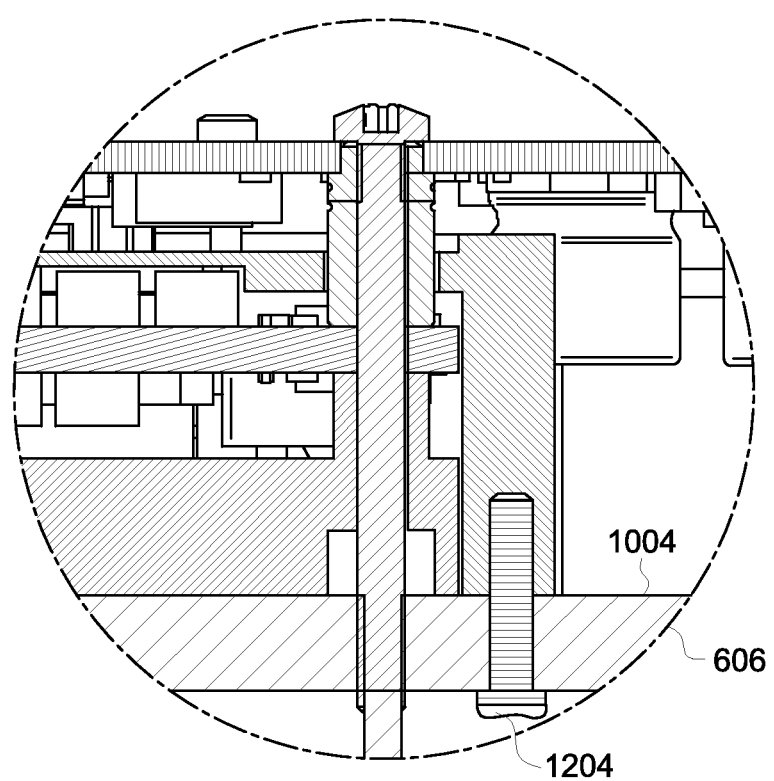
FIG. 13 depicts a detailed view of FIG. 12, the view shows the modular computing assembly being coupled to the heat sink in accordance with another illustrative embodiment.

FIG. 12 depicts the modular computing assembly 602 of FIG. 7 with the cooling adapter 106 being elastically bent to allow direct thermal contact between the heat sink and the modular computing assembly in accordance with another illustrative embodiment, and FIG. 13 shows a detail view of the modular computing assembly 602 of FIG. 12. In this embodiment, the height of the cooling adapter 106 slightly greater than the tolerance of the components of the COM express board (as shown in FIG. 9), and accounting for the tolerances of such components, a spatial gap 502 forms between the wall 118 of the cooling adapter 106 and the cooling surface of the heat sink 606. This spatial gap 502 provides a space to which the cooling adapter can elastically deform in a convex manner (as shown in convex profile 1202 in FIG. 12). A second set of attachment members 1204 provides a compressive force to draw the contact surface of the wall 118 of the cooling adapter 106 to the cooling surface of the heat sink 606.

Figure 14:
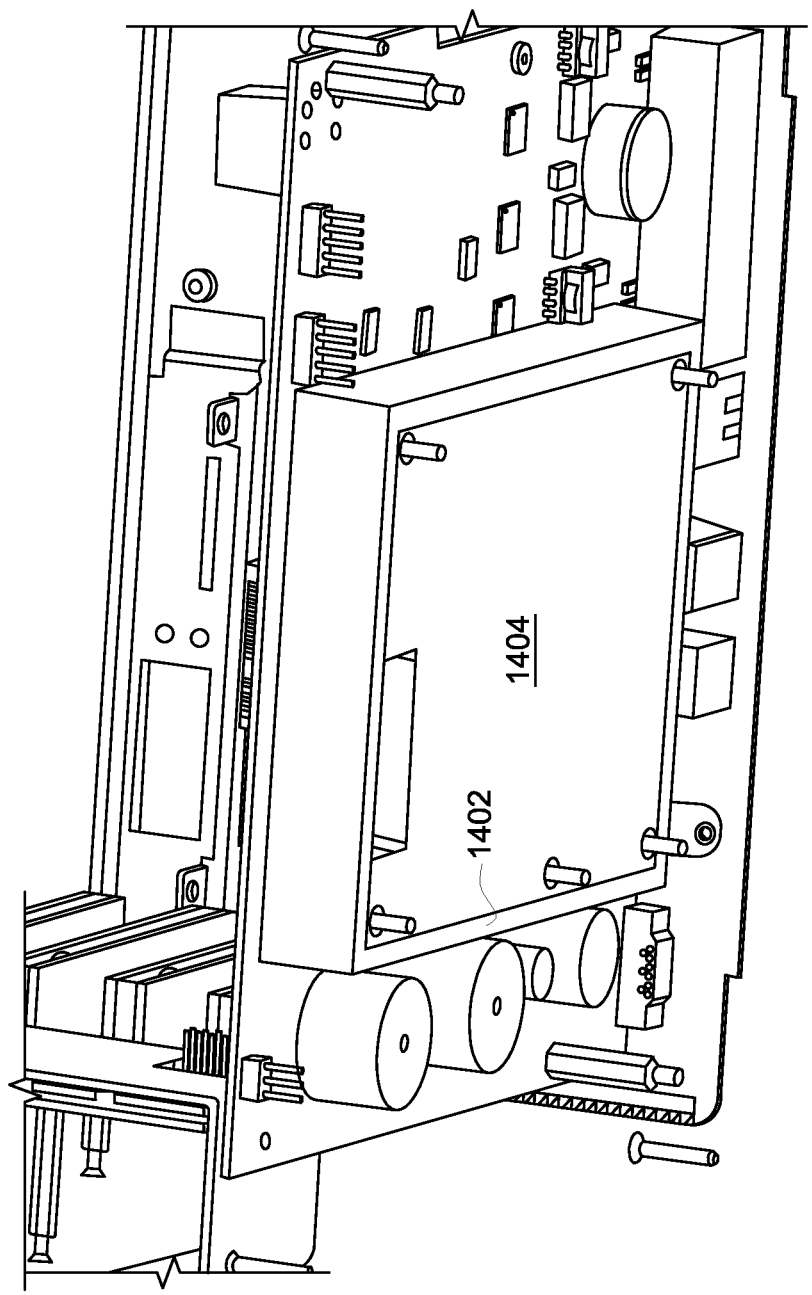
FIG. 14 depicts a perspective view of the modular computing assembly of FIG. 8 in accordance with an illustrative embodiment.

FIG. 14 depicts a perspective view of the modular computing assembly of FIG. 8 in accordance with an illustrative embodiment. The heat sink 606 is not shown. The spatial gap 502 is defined between the cooling surface 1402 of the cooling adapter 106 and the cooling surface 1404 of the cooling plate.

Figure 15:
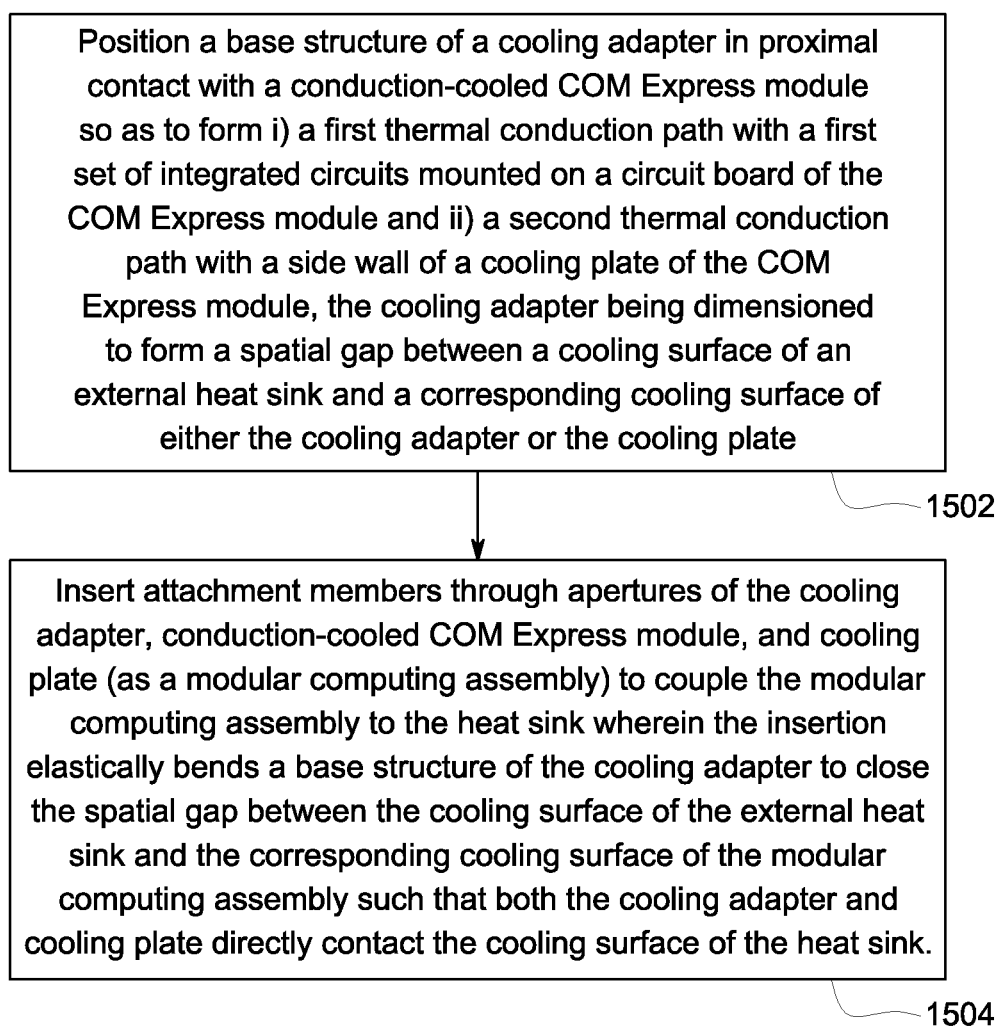
FIG. 15 is a block diagram illustrating a method of thermal regulation using an adapter module in accordance with an illustrative embodiment.

FIG. 15 is a block diagram illustrating a method 1500 of coupling a modular computing assembly 602 to a heat sink 606 so as to form direct thermal contact therebetween in accordance with an illustrative embodiment.

The method 1500 includes positioning a base structure 120 of the cooling adapter 118 in proximal contact with a conduction-cooled COM Express module 102 so as to form i) a first thermal conduction path with a first set of one or more integrated circuits 108b mounted on a circuit board 110 of the COM Express module 102 and ii) a second thermal conduction path with a side wall 126 of the cooling plate 106 of the modular computing assembly 602 (step 1502). The base structure 120 has one or more side walls 118 extending therefrom wherein each of the one or more side walls 118 are dimensioned to form a spatial gap 502 between a cooling surface 1004 of the heat sink 606 and a corresponding cooling surface of at least one of the cooling adapter 106 and the cooling plate 104 when at least one of the one or more side walls 118 of the cooling adapter 106 or the cooling plate 104 directly contacts the cooling surface 1004 of the heat sink, as shown in relation to FIGS. 10 and 12.

The method 1500 includes inserting attachment members 702 through apertures of the cooling adapter 106, conduction-cooled COM Express module 102, and cooling plate 104 to couple the modular computing assembly 602 to the heat sink 606 where the insertion elastically bends (e.g., in a concave manner as described in relation to FIG. 10 or in a convex manner as described in relation to FIG. 12) the base structure 120 of the cooling adapter 106 to close the spatial gap 502 between the cooling surface 1004 of the heat sink 606 and the corresponding cooling surface of the at least one of the cooling adapter 106 and the cooling plate 104 such that both the cooling adapter 106 and cooling plate 104 directly contacts the cooling surface 1004 of the heat sink 606 (step 1504).

While the methods and systems have been described in connection with preferred embodiments and specific examples, it is not intended that the scope be limited to the particular embodiments set forth, as the embodiments herein are intended in all respects to be illustrative rather than restrictive.

In various aspects of the disclosure, the adapter module can be used in conjunction with a single board computer (SBC) within military and aerospace applications.

In many devices, such as computers, various heat producing components can be connected to the circuit board. Such heat producing components can include a central processing unit (CPU), a Northbridge, multiple memory devices, metal-oxide-semiconductor field-effect transistors (MOSFETs), power circuits, field programmable gate arrays (FPGA), chipsets, graphics cards, hard disk drives, and the like. These components can be susceptible to temporary malfunction or permanent failure if overheated.

In some embodiments, first base structure and the second base structure discussed herein are configured to couple to a single board computer to conductively regulate temperature of electrical components on both sides of the single board computer.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A system comprising:
a modular computing device having a form that complies with VITA 59, the modular computing device having interfaces for coupling to a base board, the modular computing device including a circuit board with two opposing mountable surface areas, including a first surface area and a second surface area, for placement of a plurality of integrated circuit (IC) components, wherein when in an assembled configuration with the base board, the circuit board of the modular computing device is stacked with the base board such that the second surface area is proximal to the base board and the first surface is distal to the base board;
a first cooling member comprising a first base structure having a first cooling surface for coupling to a cooling surface of an external heat sink, the first base structure being fixably positioned proximal to the first surface area of the circuit board so as to form direct thermal conduction with surfaces associated with one or more IC components, of the plurality of IC components, mounted on the first surface area of the modular computing device;
a second cooling member comprising a second base structure that is fixably positioned proximal to the second surface area of the circuit board so as to form direct thermal conduction with surfaces associated with one or more IC components, of the plurality of IC components, mounted on the second surface area of the modular computing device, the second member comprising a plurality of side walls extending from the second base structure, each side wall including a second cooling surface and a wall contact surface, wherein when in the assembled configuration with the first cooling member and the modular computing device, each side wall of the second cooling member is proximately positionable with respect to the first cooling member such that the wall contact surface forms direct thermal conduction therewith and such that each of the first cooling surface of the first cooling member and the second cooling surface of the second cooling member forms direct thermal conduction with the cooling surface of the external heat sink; and
a plurality of attachment members to couple the base board of the modular computing component, the first cooling member, and the second cooling member together as a modular assembly, and to couple the modular assembly to the external heat sink,
wherein, prior to the one or more attachment members being coupled to the external heat sink, the modular assembly includes a spatial gap between the first cooling surface of the first base structure of the first member and the cooling surface of the external heat sink when the modular assembly is disposed on the cooling surface of the external heat sink; and
wherein the second base structure of the second member is configured to elastically deform when the one or more attached members are affixed to the external heat sink such that the first cooling surface of the first base structure of the first member directly contacts the cooling surface of the external heat sink.

2. The system of claim 1, wherein the first cooling surface of the first base structure of the first member substantially spans the first surface area of the modular computing device, and wherein the first cooling surface directly contacts the cooling surface of the external heat sink when the system is in the assembled configuration.

3. The system of claim 1, wherein the second cooling surface of the second member spans beyond the first cooling surface of the first base structure, and wherein the second cooling surface directly contacts the cooling surface of the external heat sink when the system is in the assembled configuration.

4. The system of claim 1, wherein the external heat sink comprises one selected from the group consisting of a chassis, a heat sink, a heat spreader, a heat pipe, a cooling recirculation loop, and a mechanical fan.

5. The system of claim 1, wherein the second base structure of the second member is configured to elastically deform when the one or more attached members are affixed to the external heat sink such that first cooling surface of the first cooling member aligns with the second cooling surface of the second cooling member to form a contact plane with the cooling surface of the external heat sink.

6. The system of claim 1, comprising one or more attachment members to couple the base board, modular computing component, first cooling member and second cooling member together as a modular assembly, and to couple the modular assembly to the external heat sink,
  wherein, prior to the one or more attachment members being coupled to the external heat sink, the modular assembly includes a spatial gap between the wall contact surface of the second cooling member and the cooling surface of the external heat sink when the modular assembly are disposed on the cooling surface of the external heat sink.

7. The system of claim 1, wherein the second base structure of the second cooling member has a first maximum thickness and wherein the one or more walls of the second cooling member has a second maximum thickness, and wherein the second maximum thickness is greater than the first maximum thickness.

8. The system of claim 1, wherein the second base structure and the one or more side walls of the second member form a single continuous structure.

9. The system of claim 1, wherein the circuit board of the modular computing device is dimensioned to conform to a Computer-On-Module Express standard.

10. The system of claim 1, wherein, when the first member and second member are in an assembled configuration, the contact surface, of the second base structure positioned proximal to the second surface area of the circuit board, forms a predetermined distance to the contact surface, of the first base structure, positioned proximal to the first surface area of the circuit board.

11. The system of claim 1, comprising: one or more thermal interface layers formed between the one or more integrated circuits of the circuit board of the modular computing device and the first base structure of the first member.

12. The system of claim 1, wherein the modular computing device comprises a multiple-pin terminal connector arranged in an array for coupling to a corresponding multiple-pin terminal connector, the second base structure of the second member comprising one or more apertures for providing a connector termination for the multiple-pin terminal connector of the circuit board.

13. The system of claim 1, wherein at least one of the one or more apertures of the second base structure is positioned proximal and corresponding to the multiple-pin terminal connector when the second member is mounted with the circuit board.

14. The system of claim 1, wherein the integrated circuit (IC) components comprises, at least, one or more processor and memory integrated circuits (ICs).

15. The system of claim 1, wherein a thermal interface material is applied between the modular computing device and the second base structure.

16. An apparatus for coupling a modular computing assembly to a heat sink, the modular computing assembly having a modular computing device having a form factor that complies with VITA 59 and coupled to a cooling plate, the apparatus comprising:

a base structure, wherein the base structure is proximally positionable to a first surface area of a circuit board of a modular computing device so as to form direct thermal conduction with a first set of one or more IC components mounted on the first surface area of the modular computing device; and a plurality of side walls extending from the base structure, each side wall including a cooling surface and a wall contact surface, wherein when in the assembled configuration with the modular computing assembly, each of the plurality of side walls is proximately positionable with respect to the cooling plate such that the wall contact surface forms direct thermal conduction therewith and such that the cooling plate of the modular computing assembly and each of the cooling surfaces of the plurality of side walls forms direct thermal conduction with the heat sink wherein, prior to a plurality of attachment members being coupled to the base structure to couple the modular computing assembly to the heat sink, the modular computing assembly includes a spatial gap between a cooling surface of the cooling plate and corresponding cooling surface of the heat sink; and wherein the base structure is configured to elastically deform when the attached members are affixed to the base structure and to the heat sink such that the cooling surface of the plurality of side walls directly contact the cooling surface of the heat sink and such that the cooling surface of the cooling plate directly contact the corresponding cooling surface of the heat sink.

17. A method for coupling a modular computing assembly having a form factor that complies with VITA 59, to a heat sink so as to form direct thermal contact therebetween; and a plurality of attachment members to couple the base board of the, modular computing component a form that complies with VITA 59, the first cooling member having, and the second cooling member together as a modular assembly, and to couple the modular assembly to the external heat sink, wherein, prior to the one or more attachment members being coupled to the external heat sink, the modular assembly includes a spatial gap between the first cooling surface of the first base structure of the first member and the cooling surface of the external heat sink when the modular assembly is disposed on the cooling surface of the external heat sink; and wherein the second base structure of the second member is configured to elastically deform when the one or more attached members are affixed to the external heat sink such that the first cooling surface of the first base structure of the first member directly contacts the cooling surface of the external heat sink.

* * * * *